(12) United States Patent
Clark

(10) Patent No.: US 7,102,463 B2
(45) Date of Patent: Sep. 5, 2006

(54) PRINTED CIRCUIT BOARD (PCB) WHICH MINIMIZES CROSS TALK AND REFLECTIONS AND METHOD THEREFOR

(75) Inventor: Clifford Clark, Chandler, AZ (US)

(73) Assignee: Cytek Corporation, Knoxville, TN (US)

(*) Notice: Subject to any disclaimer, the term of this patent is extended or adjusted under 35 U.S.C. 154(b) by 251 days.

(21) Appl. No.: 10/160,465

(22) Filed: May 30, 2002

(65) Prior Publication Data

US 2003/0221865 A1 Dec. 4, 2003

(51) Int. Cl.
*H01P 9/00* (2006.01)

(52) U.S. Cl. .................. 333/156; 174/260; 361/763
(58) Field of Classification Search ............. 174/260; 361/777, 763, 738, 780, 794; 333/12, 1, 156, 333/161, 246, 139, 138, 164
See application file for complete search history.

(56) References Cited

U.S. PATENT DOCUMENTS

| | | | | |
|---|---|---|---|---|
| 3,585,535 A | * | 6/1971 | Senf | 333/161 |
| 3,594,665 A | * | 7/1971 | Metcalf et al. | 333/156 |
| 4,942,373 A | * | 7/1990 | Ozawa et al. | 333/161 |
| 5,497,037 A | * | 3/1996 | Lee et al. | 307/42 |
| 5,587,887 A | * | 12/1996 | Price et al. | 361/794 |
| 5,764,491 A | * | 6/1998 | Tran | 361/794 |
| 5,815,050 A | * | 9/1998 | Brooks et al. | 333/161 |
| 6,522,222 B1 | * | 2/2003 | Pchelnikov et al. | 333/161 |

* cited by examiner

*Primary Examiner*—Randy W. Gibson
*Assistant Examiner*—I B Patel
(74) *Attorney, Agent, or Firm*—Jeffrey D. Moy; Harry M. Weiss; Weiss, Moy & Harris, P.C.

(57) ABSTRACT

This invention relates to semiconductor devices and to printed circuit boards (PCB) or circuit assemblies used to electrically connect components. Delay devices are associated with the conductive traces or with integrated circuits. Delay is used to offset then realign the wave edges of propagating signals so as to minimize electric field effects on nearby signals. Impedance controlling devices are used to minimize reflections. The effects of split planes may be minimized or negated.

7 Claims, 9 Drawing Sheets

TRACES AND COMPONENTS ARE ON THE TOP LAYER OF THE PRINTED CIRCUIT BOARD.
PLANES AND PLANE SPLIT ARE ON THE LAYER BELOW THE PRINTED CIRCUIT BOARD.
THE LAYERS ARE SEPARTED BY A DIELECTRIC

Figure 1. Cross-section of a simple printed circuit board (Prior Art)

Figure 2, Typical cross section of printed circuit board (Prior Art)

Figure 3, Typical cross section of printed circuit board with a split plane
(Prior Art)

Figure 4. Electric fields coupling between nearby traces
(Prior Art)

Figure 5. Separating traces to reduce or negate Electric field coupling between nearby traces
(Prior Art)

Figure 6. Missing ground or voltage plane causes electric field lines to spread and increase coupling between nearby traces (Prior Art)

Figure 7. Block Diagram of Typical Printed Circuit Board Device Interconnect (Prior Art)

Figure 8. Signals crossing a split plane
(Prior Art)

Figure 9

TRACES AND COMPONENTS ARE ON THE TOP LAYER OF THE PRINTED CIRCUIT BOARD.
PLANES AND PLANE SPLIT ARE ON THE LAYER BELOW THE PRINTED CIRCUIT BOARD.
THE LAYERS ARE SEPARATED BY A DIELECTRIC

Figure 10

TRACES AND COMPONENTS ARE ON THE TOP LAYER OF THE PRINTED CIRCUIT BOARD.
PLANES AND PLANE SPLIT ARE ON THE LAYER BELOW THE PRINTED CIRCUIT BOARD.
THE LAYERS ARE SEPARATED BY A DIELECTRIC

TRACES AND COMPONENTS ARE ON THE TOP LAYER OF THE PRINTED CIRCUIT BOARD.
PLANES AND PLANE SPLIT ARE ON THE LAYER BELOW THE PRINTED CIRCUIT BOARD.
THE LAYERS ARE SEPARATED BY A DIELECTRIC

Figure 13

Figure 14, Resistor spanning the plane split

Figure 17, Solution embedded in Serpentine

Figure 18, Internal Delay implementation

PRINTED CIRCUIT BOARD (PCB) WHICH MINIMIZES CROSS TALK AND REFLECTIONS AND METHOD THEREFOR

FIELD OF THE INVENTION

This invention relates to semiconductor devices and, more specifically, to printed circuit boards (PCB) or circuit assemblies used to electrically connect components which will minimize cross talk between signals and minimize reflections of signals contained in a circuit assembly. Further, the effects of split planes may be minimized or negated.

BACKGROUND OF THE INVENTION

Figure 1:
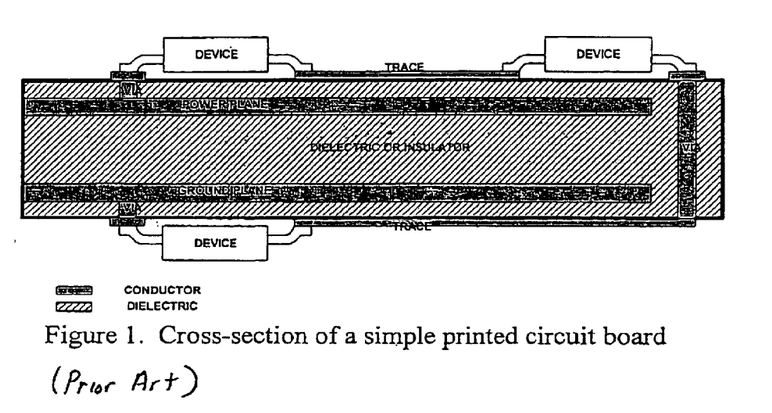
FIG. 1 is a cross-sectional view of a prior art printed circuit board.

Printed circuit boards (PCBs), also called printed wiring boards (PWBs) are used to electrically connect one or more electronic components. Electrical devices are usually attached to the top or bottom of the printed circuit board. Conductive material called a "trace" connects the electrical devices mounted to the printed circuit board. Conductive planes may be placed above or below the traces. The traces and the planes may be separated by a dielectric or non-conductive material. The conductive planes may be used for a plurality of different purposes. For example, the conductive planes may be used as an electrical ground plane functioning as an electrical ground return path. The conductive plane may also be used as an electrical power plane functioning as a power distribution path. Together, the trace and plane provide a complete electrical path to and from electrical components associated with a printed circuit board. Generally speaking, traces typically connect signal paths of electronic components associated with a printed circuit board, while planes typically connect power or ground paths of electrical components associated with a printed circuit board. A cross-section of a simple example of a printed circuit board is depicted in FIG. 1.

Figure 2:
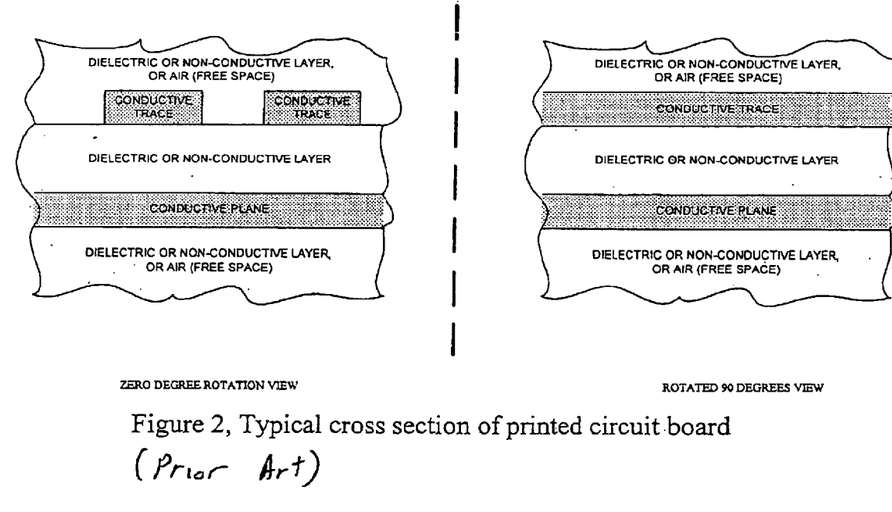
FIG. 2 are simplified rotated views of the prior art printed circuit board depicted in FIG. 1.

Trace layers, dielectric or non-conductive layers, and plane layers may be repetitiously laminated to increase the number of traces available for connecting electrical components. A typical cross section of printed circuit board is shown below in FIG. 2.

Figure 3:
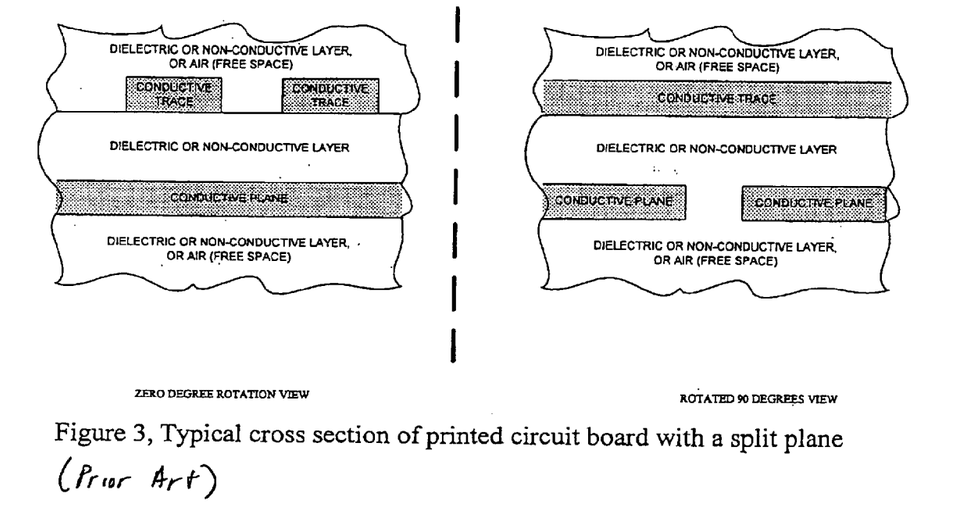
FIG. 3 are simplified rotated views of prior art printed circuit board with split planes.

Minimizing layers is desirable to reduce the cost of a printed circuit board. A power plane or ground plane may often be segmented or discontinuous. One segment of a plane may be used to distribute a voltage, while another segment is used to distribute a different voltage or to serve as an electrical ground. These segments may be coplanar. A segmented ground plane may provide a current path or current return path for more than one voltage. A typical cross section of printed circuit board with split planes is shown below in FIG. 3.

Figure 4:
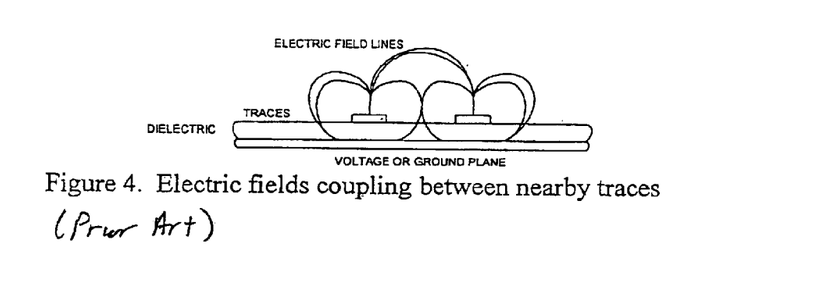
FIG. 4 is a simplified diagram showing electric field coupling between traces on a prior art printed circuit board.

An electrical driver may electrically raise or lower a voltage value of an associated trace. The voltage value often corresponds to a logic value. As the electrical driver attempts to change the voltage value of the trace, a charging current propagates down the trace. A wave edge is created. The edge represents a change in current and a change in voltage. These changes are accompanied by electric fields. As the electric signal propagates down the trace, power or ground planes may provide a return path for current and electric fields. Electric fields produced by the propagating signal follow the signal down the trace. These electric fields may couple to nearby traces and induce an undesired artifact on other signals. See FIG. 4

Figure 5:
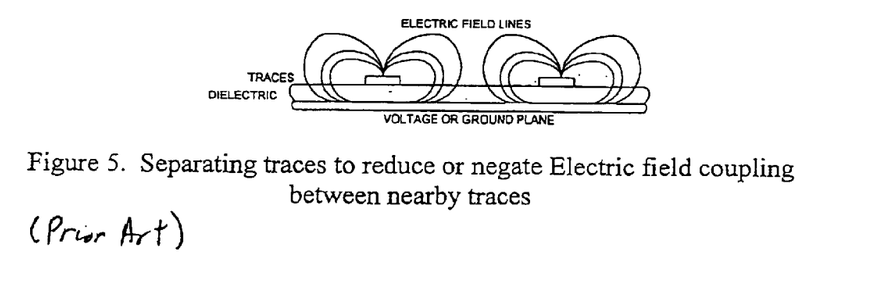
FIG. 5 shows a prior art printed circuit board which separates the traces to alleviate electric field coupling between nearby traces.

The induced signals travel in approximately the same direction as the original signal when traces are approximately parallel. Proper design dictates spacing traces far enough apart to reduce or negate the undesired coupling when possible. See FIG. 5.

Figure 6:
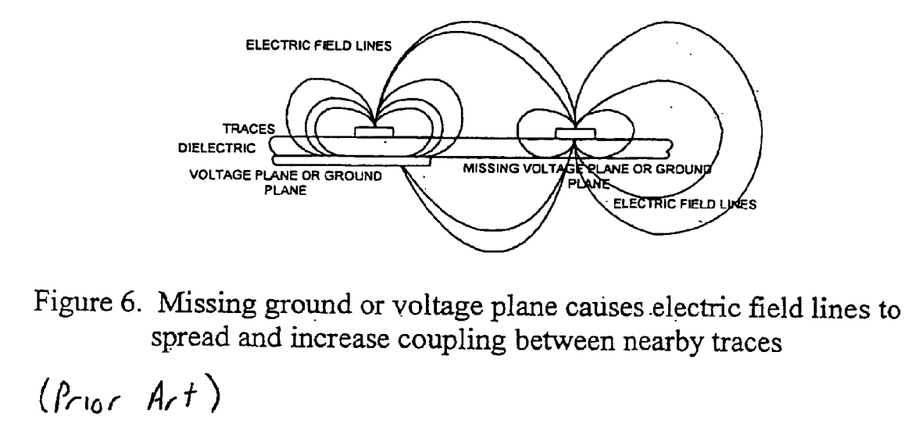
FIG. 6 shows a prior art printed circuit board which separates the traces to alleviate electric field coupling between nearby traces and how missing planes may cause electric field coupling between nearby traces.

When power planes or ground planes are discontinuous (split, segmented), propagating signals that cross the split encounter a discontinuity in the conductive plane return path. The discontinuity effects the signal and the associated electric fields. As the leading edge of the signal approaches the area of a plane split, the associated electric fields spread away from the originating trace, and may induce an undesired signal on a nearby trace (See FIG. 6). Additional separation of the traces is usually impractical to avoid this increased coupling, since the area of the printed circuit board is limited and costly.

Electronic circuits receiving signals of effected traces may sample erroneous electrical values at their inputs. Sampling an erroneous value is undesirable. Another effect of the discontinuous plane is a change in the electrical impedance of the trace. Since geometry is a factor in the impedance of a trace, a change in geometry causes a change in the trace impedance. A change of impedance causes reflections of the propagating signal.

Therefore, a need existed to provide an improved printed circuit board and method to overcome the above problem. The improved printed circuit board and method must minimize cross talk between signals on the printed circuit board. The improved printed circuit board and method must further minimize reflections due to split planes on the printed circuit board.

SUMMARY OF THE INVENTION

In accordance with one embodiment of the present invention, it is an object of the present invention to provide an improved electrical connector, such as a printed circuit board, and method to overcome the problems associated with the prior art printed electrical connectors.

It is another object of the present invention to provide an improved printed circuit board and method that minimize cross talk between signals on the printed circuit board due to split planes on the printed circuit board.

It is still another object of the present invention to provide an improved printed circuit board and method that minimizes reflections due to split planes on the printed circuit board.

BRIEF DESCRIPTION OF THE EMBODIMENTS

In accordance with one embodiment of the present invention, a printed connection board to electrically couple electrical components is disclosed. The printed connection board has non-conductive layers. Conductive planes are formed on the non-conductive layers. Conductive traces are formed on the non-conductive layer to provide signal paths for the electrical components. Delay devices coupled to the conductive traces to space apart signals so as to minimize electric field effects on nearby signals.

In accordance with another embodiment of the present invention, a method of forming a printed connection board which minimizes cross talk and reflections is disclosed. The method comprises the steps of: forming segmented conductive planes between non-conductive layer; laying conductive traces on the non-conductive layer to provide signal paths for electrical components wherein the conductive traces are segmented to minimize reflections due to the segmented conductive planes; coupling delay devices to the conductive traces to space apart signals so as to minimize electric field effects on nearby conductive traces to minimize electric field effects on the conductive traces; and coupling a resistive element to segmented conductive traces to minimize reflections due to the segmented conductive planes.

BRIEF DESCRIPTION OF THE DRAWINGS

Common reference numerals are used throughout the drawings and detailed description to indicate like elements.

DETAILED DESCRIPTION

Figure 7:
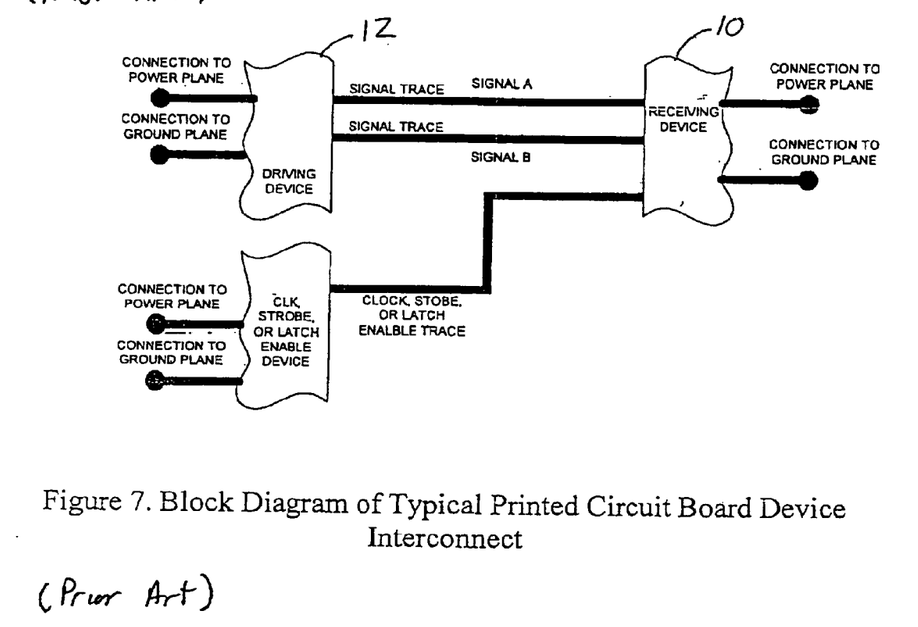
FIG. 7 is a simplified functional block diagram of a prior art printed circuit board with interconnects.

Signals are typically sampled at a time when a receiving electronic component receives a second signal causing the first signals to be sampled. A signal that indicates when other signals are to be sampled is often referred to as "clock", or "strobe", or "latch enable", or "latch". Referring to FIG. 7, an electronic component sending signal "A", signal "B" and a clock generator sending "clock" is shown. A receiving device 10 connects to signal A, signal B and Clk. Signal A and signal B are required to arrive at the receiving device 10 before Clk. The amount of time signal A and signal B is required to be valid before Clk is often referred to as "setup". The a mount of time signal A and signal B is required to be valid after Clk is often referred to as "hold". Setup and hold times are specifications of the receiving device.

Figure 8:
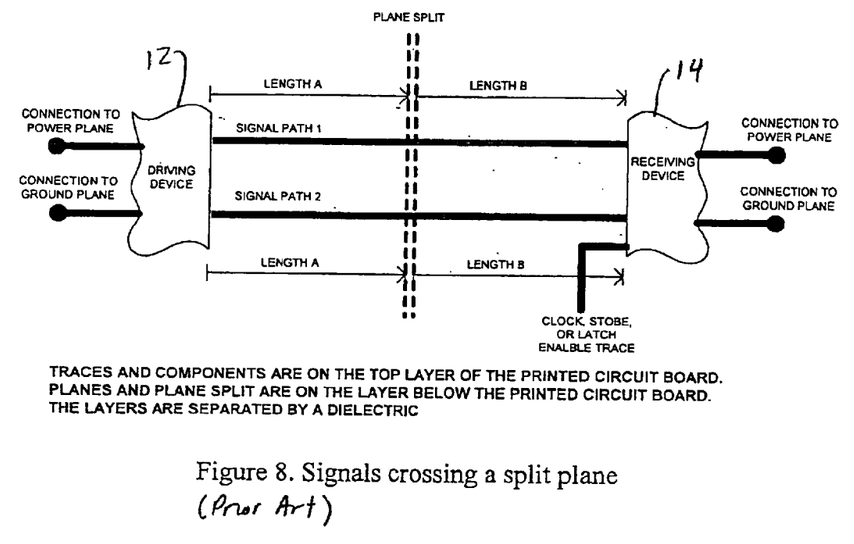
FIG. 8 is a simplified view showing how signals cross a split plane on a prior art printed circuit board.

Referring to FIG. 8, two nearby signal paths are considered. Signals are launched from one or more driving device(s) 12 at approximately the same time. The signal edge propagates down their respective signal paths or traces. Electric fields follow the propagating signals. For length "A", the traces are space sufficiently far apart so that their electric fields induce either an acceptable amount of signal artifacts from one trace to the other, or the signals induce no significant signal artifacts upon one another. Each signal path or trace retains the intended signal along length "A". As signal 1 crosses the plane split, electric field lines from signal 1 expand near the split. The expanded electric fields from signal 1 electrically couple to signal path 2. The electric field from signal 1 induces an erroneous signal onto signal path 2. Signal 2 also induces an erroneous signal on signal path 1 at the discontinuity as well.

As signal 1 and signal 2 propagate across the plane split, artifacts induced from signal 1 to signal path 2 also propagate along signal path 2 to the end of segment "B" and arrive at the receiver. Likewise, the same thing occurs on signal path 1 due to signal 2 crossing the plane split.

Signals from path 1 and path 2 arrive at the receiver 14 within the time period that the receiver 14 samples these signal paths. The induced artifacts from signal 1 to signal path 2 arrive at the receiver 14 within the time period that the receiver 14 samples these signal paths as well. The induced artifacts from signal 2 to signal path 1 also arrive at the receiver 14 within the time period that the receiver samples these signal paths.

It is desirable to minimize or negate the undesirable cross-talk effects of routing electrical signal paths over discontinuous (split) power planes or discontinuous (split) ground planes. This is due to the fact that signal paths that span discontinuous, split power planes or discontinuous, split ground planes may couple their signals to nearby signal paths. Undesirable, erroneous signal artifacts may be sampled by receiving devices when erroneous signals are induced on a nearby signal path. To reduce or remove the possibility that an erroneous signal is sampled, the erroneous signal can be moved outside of the time period when intended signals are sampled.

One may conclude that the following design method will break timing constraints of the systems where the method is intended to be used. However, one should understand that trace lengths are commonly matched to reduce timing skew. Hence, this method of design may be implemented within the length of traces added for length matching. This method of design may also be implemented within delays existing elsewhere in an electrical system. The described design method may be used with little or no impact on the timing constraints of the system.

The described design method implements delays in signal paths at locations that move the erroneous signal artifacts outside of the time period when signals are sampled. In the following embodiment, a delay is implemented on the printed circuit board external to the driving or receiving agents. However, this should not be seen as to limit the scope of the present invention. The delay may also be implemented internal to the driving or receiving agents.

Figure 9:
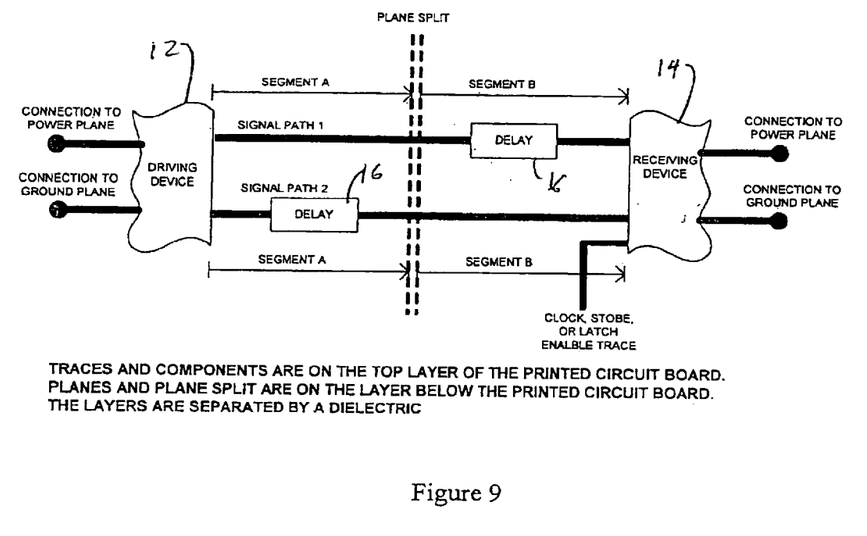
FIG. 9 is a simplified functional block diagram of a printed circuit board of the present invention.

Now referring to FIG. 9, a delay 16 is inserted on signal path 1 in segment B and a delay 16 on segment A of signal path 2. The delay 16 on signal path 1 is approximately equal to the delay 16 on signal path 2. Signals are launched from a driving device 12 or driving devices 12 at approximately the same time. The signal wave propagates down their respective paths. Electric fields follow the leading edge of propagating signals.

Along length "A", the signals or traces are spaced sufficiently far apart so that their electric fields induce either no signal artifacts upon one another or induce an acceptable amount of signal artifacts from one trace to the other. Each signal path retains the intended signal along segment "A".

Figure 10:
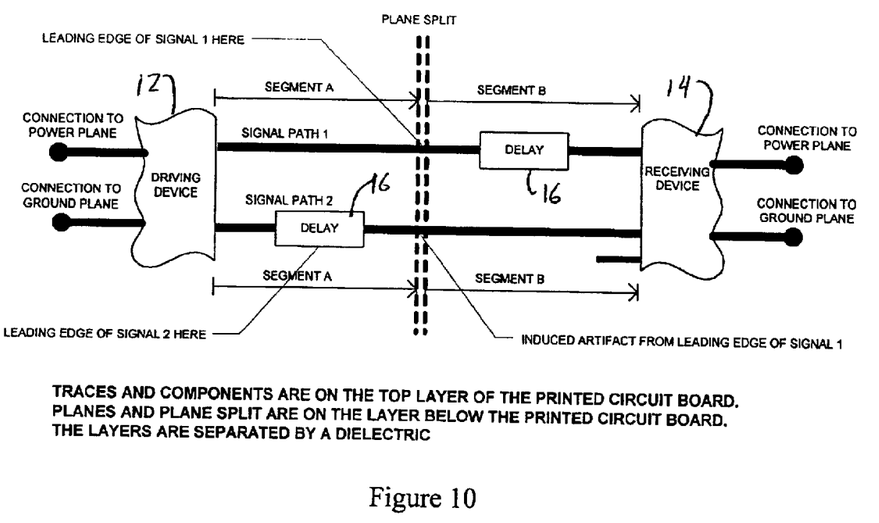
FIG. 10 depicts the leading edge of signal 1 and signal 2 after a period of time T1.

However, since delay 16 is encountered on signal path 2 in segment "A", the leading edge of signal 1 on path 1 crosses the split plane first. So, the leading edge of signal 1 induces artifacts on signal path 2 before the leading edge of signal 2 reaches the split plane (See FIG. 10).

Figure 11:
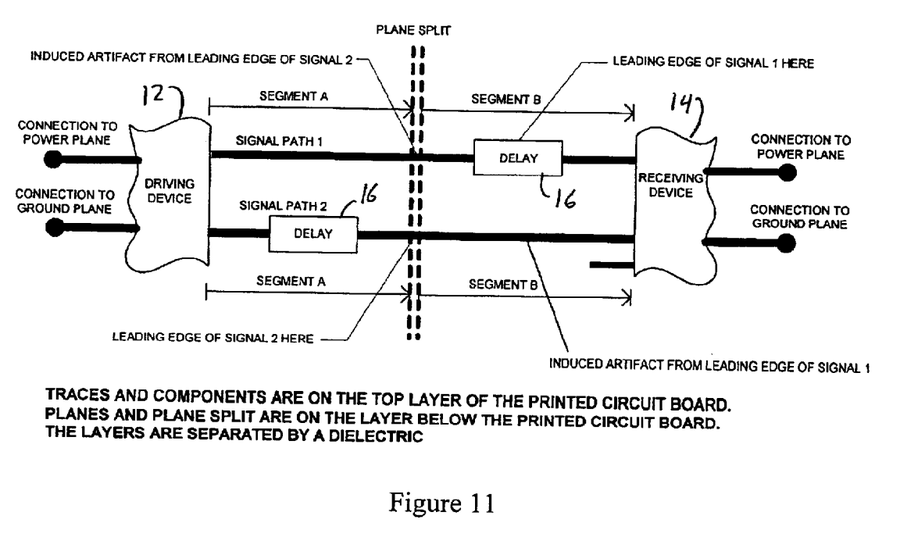
FIG. 11 depicts the leading edge of signal 1 and signal 2 after a period of time T2.

Later, the wave front of signal 2 on signal path 2 crosses the split plane and induces artifacts on signal path 1. However, the wave front of signal path 1 has already passed the split. The induced signal on path 1 from signal 2 is behind and separated from the wave front of signal 1 (See FIG. 11).

Figure 12:
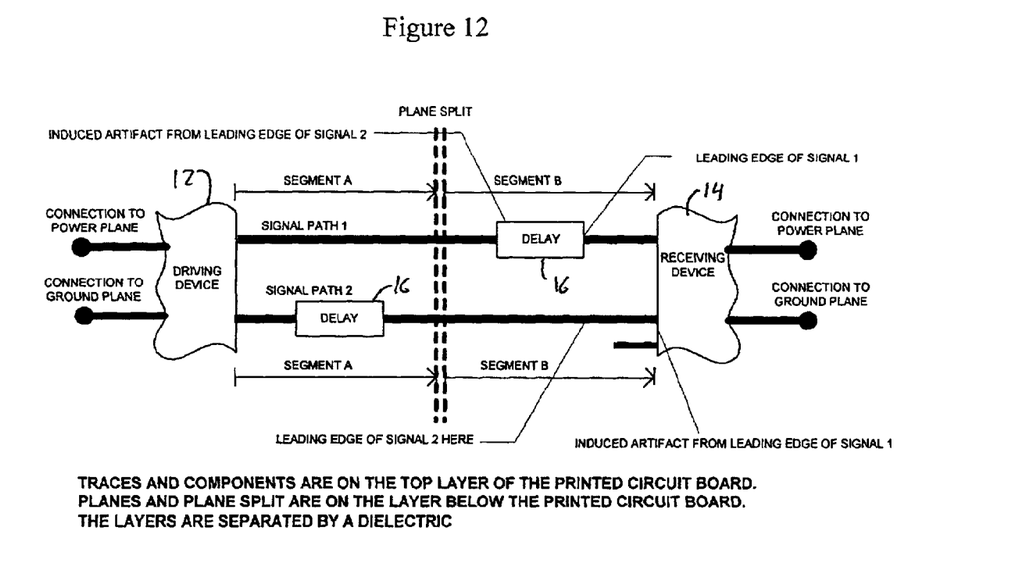
FIG. 12 depicts the leading edge of signal 1 and signal 2 after a period of time T3.

The wave front of signal path 1 now encounters delay 16 on segment "B" of signal path 1. The induced artifact caused by the wave edge on signal path 1 is now propagating on signal path 2. The induced artifact on signal path 2 does not encounter delay 16 segment "B" and arrives at the receiver ahead of the wave edge on signal path 1 (See FIG. 12).

Figure 13:
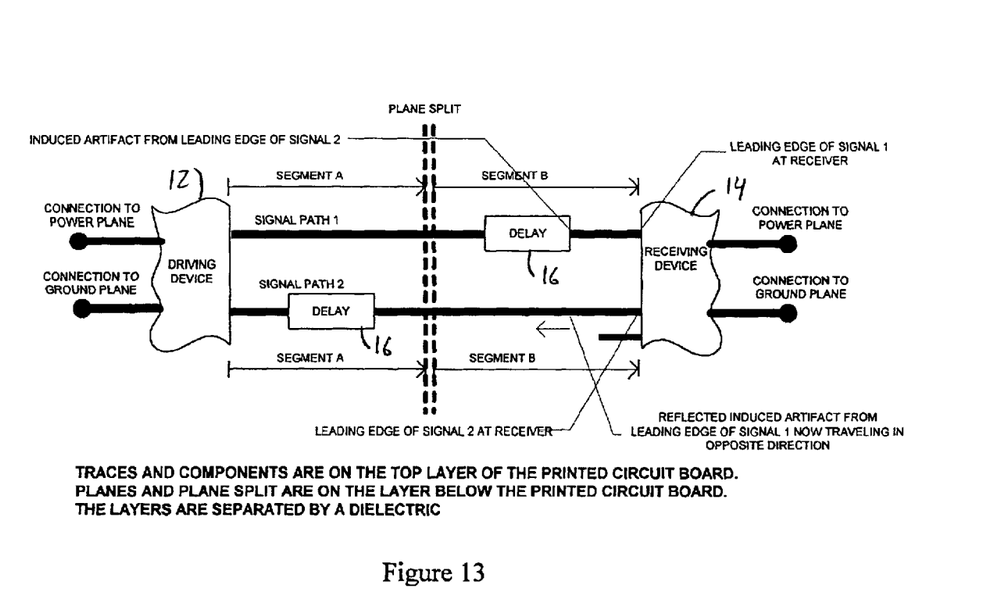
FIG. 13 depicts the leading edge of signal 1 and signal 2 after a period of time T4.
Figure 14:
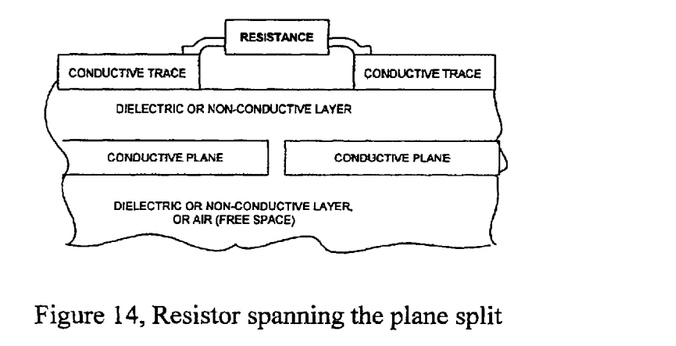
FIG. 14 is a simplified block diagram of one embodiment of the printed circuit board of the present invention which minimizes reflections due to split planes.

If signal path 2 ends at the receiver, a reflection of the artifact may be sent back in the direction of the driver 12. If signal path 2 is terminated at the signal path impedance, no reflection occurs. If the signal path 2 continues, the artifact continues to propagate pass the receiver 14 (See FIG. 13, FIG. 14, FIG. 15).

Since signal path 2 has no delay element on segment B, the leading edges of the intended signals arrive at the receiver 14 at approximately the same time. Recall that path A and path B have approximately the same amount of delay 16 each. The induced artifact is now some distance away from the receiver 14 traveling away from the receiver or its reflection has been absorbed by proper termination of the signal path. If the value of delay 16 is chosen so that the amount of time is greater than sample period of the receiver 14, no artifact will be sampled at the receiver 14.

Recall that the wave front on signal path 2 crossed the plane split "delay" time after the wave front of signal path 1. So, the wave front on signal path 2 induces an artifact on signal path 1 "delay" behind wave front of signal path 1. This second artifact also propagates on signal path 1. However, artifact 2 reaches the receiver 14 on path 1 sometime after the wave fronts on either signal path 1 or signal path 2. If the value of delay 16 is chosen so that the amount of time is greater than the sample period of the receiver 14, no artifact will be sampled at the receiver 14 whether artifact 2 is reflected or absorbed.

This method of design can be used to move artifacts out of the sample period of a receiver 14 whether signal path 1 crosses a plane split, signal path 2 crosses a plane split, or multiple signal paths cross a plane split. The design method may be used to negate undesirable induced signals from other than split plane origin.

Implementation of delay 16 can be accomplished externally or internally to the driving agent 12 or receiving agent 14. Although the method of delay 16 is unimportant, suggested implementation of external delays 16 may consist of lengths of conducting trace or signal path, delay lines, logic elements, capacitance, or other circuit elements that exhibit delay. Suggested internal delays 16 may consist of lengths of internal interconnect, delay lines, logic elements, capacitance, or other circuit elements that exhibit delay.

Figure 15:
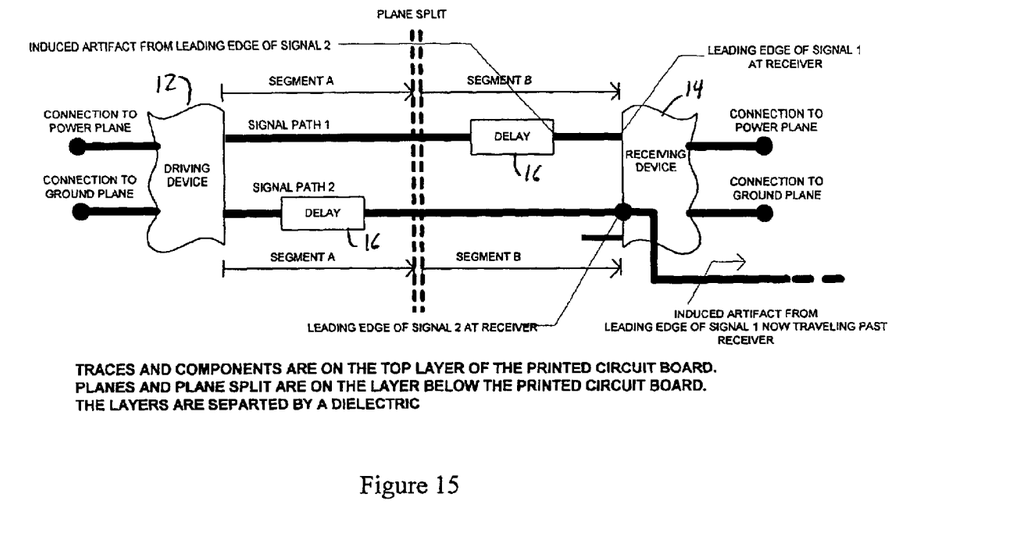
FIG. 15 is an alternative embodiment for FIG. 13.

If the trace continues past the receiver 14, the erroneous signal induced from a nearby trace travels away from the receiver 14 in the original direction. This possibility is depicted in FIG. 15.

Figure 16:
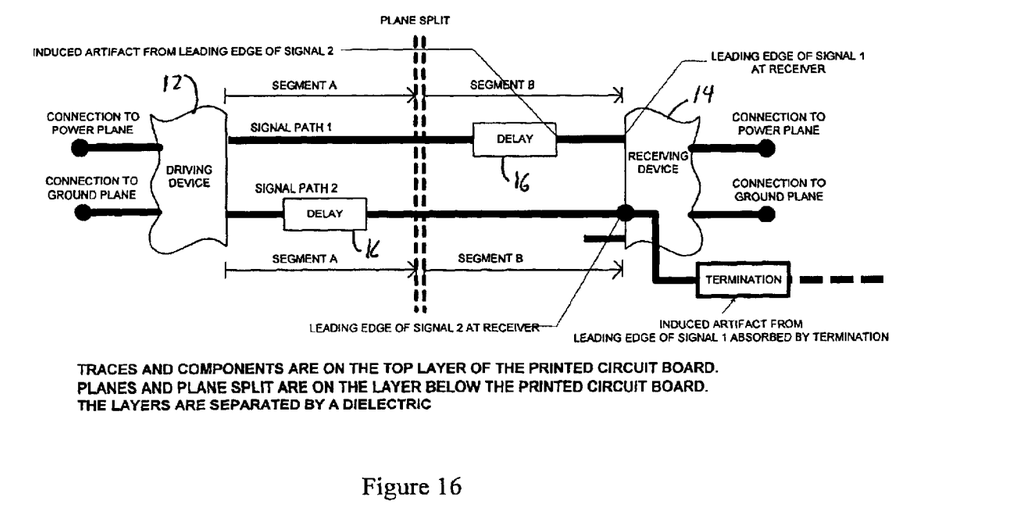
FIG. 16 is an alternative embodiment for FIG. 13.

If the trace is properly terminated near the receiver 14, the erroneous signal does not reflect. This possibility is depicted in FIG. 16.

Figure 17:
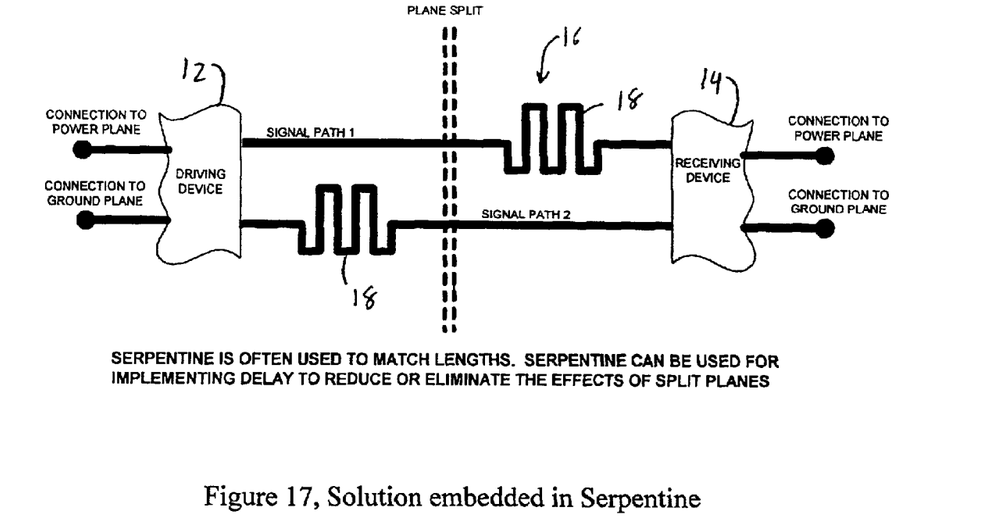
FIG. 17 is a simplified block diagram of one embodiment of the printed circuit board of the present invention which minimizes cross talk.

There are several ways for implementing delay. FIG. 17 depicts delay implemented externally to either the driving 12 or receiving devices 14. Serpentine traces 18 are one way for implementing delays 16. What makes this approach novel is alternating the serpentine 18 on nearby traces to different sides of the split plane. The alternation of delay 16 creates the aforementioned solution. To avoid additional system delay, embed the aforementioned solution into planned serpentine.

Figure 18:
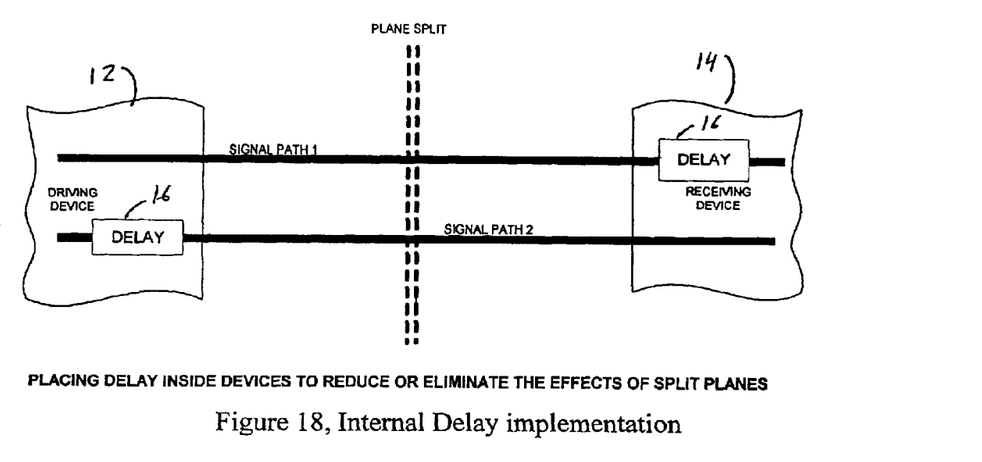
FIG. 18 is a simplified block diagram of another embodiment of the printed circuit board of the present invention which minimizes cross talk.

Delay may also be implemented internally to the receiving 14 or driving devices 12. Refer to FIG. 18, internal delay 16 implementation is shown. A combination of different types of implementation can be used to affect the aforementioned solution.

The geometry of the cross-section of circuit boards influences the characteristic impedance of the traces that comprise the circuit board. This geometry is changed abruptly when a plane split occurs. The abrupt impedance change creates reflections of signals that are referenced to the plane segments. It is desirable to minimize or negate the undesirable reflection effects of routing electrical signal paths over discontinuous, (split) power planes or discontinuous, (split) ground planes.

Although resistive devices have been used to match electrical impedance, their use to minimize the effects of split planes is novel and somewhat more complicated. A geometrical constraint must be met for a resistive device to minimize reflections. The abrupt impedance change caused by signals spanning split planes can be minimized or negated by interrupting the trace and substituting a resistor or device performing the function of a resistor that spans across the plane split, electrically connecting one part of the trace with the other. The device's resistance value should be the same or nearly the same as the characteristic impedance of the trace. Of new and novel importance, the physical length of the resistor must be greater than the plane split and any fringing effects (spreading of electric fields) to provide consistent impedance across the split.

To minimize the possibility of distortion to the signal caused by the resistor, low inductance resistors are best used. Resistive devices may be placed in parallel to reduce their inductance. The resistor minimizes or negates the impedance change due to discontinuous planes. In place of a resistor, a device may be used that performs a similar function as a resistor. Such devices include various types of transistors, etc.

The described methods of design can be used to prevent undesirable artifacts from being sampled at a receiving agent. Agents other than discontinuous split planes may cause these undesirable artifacts. The artifact may be separated from the desired event by a delay greater than the sampling period of the receiver.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A printed connection board to electrically couple electrical components and which minimizes cross talk and reflections comprising:
   non-conductive layers;
   conductive split planes formed on a top surface of one of the non-conductive layers;
   conductive traces formed on a top surface of another non-conductive layer to provide signal paths for the electrical components; and
   a circuit coupled to the conductive traces to space apart signals so as to minimize electric field effects on nearby signals, the circuit comprising:
      a first delay device coupled to a first conductive trace; and
      a second delay device coupled to a second conductive trace;
      wherein the first delay device and the second delay device are used to space apart signals so as to minimize electric field effects on nearby signals, the first and second delay devices are positioned on opposite sides of the conductive split plane.

2. A circuit for minimizing cross talk and reflections in accordance with claim 1 wherein the first and second delay devices delay signals from the first conductive trace and the second conductive traces for approximately a same amount of time.

3. A circuit for minimizing cross talk and reflections in accordance with claim 1 wherein the first and second delay devices are serpentine conductive traces.

4. A circuit for minimizing cross talk and reflections in accordance with claim 1 wherein the first and second delay devices offset then realign wave edges of the signals so as to minimize electric field effects on the nearby signals.

5. A printed connection board to electrically couple electrical components and which minimizes cross talk and reflections comprising:
   non-conductive layers;
   conductive split planes formed on a top surface of one of the non-conductive layers;
   conductive traces formed on a top surface of another non-conductive layer to provide signal paths for the electrical components; and
   a circuit coupled to the conductive traces to space apart signals so as to minimize electric field effects on nearby signals, the circuit comprising:
      a first delay device coupled to a first conductive trace; and
      a second delay device coupled to a second conductive trace;
      wherein the first delay device and the second delay device offset then realign wave edges of the signals so as to minimize electric field effects on the nearby signals, the first and second delay devices are positioned on opposite sides of the conductive split plane.

6. A circuit for minimizing cross talk and reflections in accordance with claim 5 wherein the first and second delay devices delay signals from the first conductive trace and the second conductive traces for approximately a same amount of time.

7. A circuit for minimizing cross talk and reflections in accordance with claim 5 wherein the first and second delay devices are serpentine conductive traces.

* * * * *